US006982010B2

(12) United States Patent
Liu

(10) Patent No.: US 6,982,010 B2
(45) Date of Patent: Jan. 3, 2006

(54) HIGH PERFORMANCE RARE EARTH-IRON GIANT MAGNETOSTRICTIVE MATERIALS AND METHOD FOR ITS PREPARATION

(75) Inventor: Zheng Liu, Beijing (CN)

(73) Assignee: Materitek Co. Ltd., Beijing (CN)

( * ) Notice: Subject to any disclaimer, the term of this patent is extended or adjusted under 35 U.S.C. 154(b) by 176 days.

(21) Appl. No.: 10/285,180

(22) Filed: Oct. 31, 2002

(65) Prior Publication Data

US 2004/0003870 A1 Jan. 8, 2004

(30) Foreign Application Priority Data

Jul. 4, 2002 (CN) .............................. 02123585 A

(51) Int. Cl.
*H01F 1/053* (2006.01)
(52) U.S. Cl. ....................... 148/101; 148/102; 148/103
(58) Field of Classification Search ................ 148/100, 148/101, 102, 103
See application file for complete search history.

(56) References Cited

U.S. PATENT DOCUMENTS

| 3,871,835 A | * | 3/1975 | Bibring et al. ........... 428/539.5 |
| 4,208,225 A | * | 6/1980 | Kurz et al. .................. 148/101 |
| 4,308,474 A | * | 12/1981 | Savage et al. ................ 310/26 |
| 4,921,551 A | * | 5/1990 | Vernia et al. ................ 148/101 |
| 6,273,966 B1 | * | 8/2001 | Snodgrass et al. .......... 148/301 |

OTHER PUBLICATIONS

A Dictionary of Metallurgy, A. D. Merriman, 1958, p. 326.*

* cited by examiner

*Primary Examiner*—John P. Sheehan
(74) *Attorney, Agent, or Firm*—Tucker Ellis & West LLP

(57) ABSTRACT

The present invention relates to a high performance rare earth-iron giant magnetostrictive material of the formula $(Tb_{x1}Dy_{x2}Sm_{x3}Ho_{x4}R_{x5})(S_{y1}P_{y2}Fe_{1-y1-y2-y3}T_{y3})_Q$ obtained by using an industry grade pure iron, instead of physically pure iron such as electrolyzed pure iron or hydrogen reduced pure iron, as iron source. The invention relates also to a method of preparing the giant magnetostrictive material.

7 Claims, 1 Drawing Sheet

HIGH PERFORMANCE RARE EARTH-IRON GIANT MAGNETOSTRICTIVE MATERIALS AND METHOD FOR ITS PREPARATION

BACKGROUND OF THE INVENTION

The present invention relates to a high performance rare earth-iron giant magnetostrictive material. More particularly, the present invention relates to a high performance rare earth-iron giant magnetostrictive material obtained by using an industry grade pure iron, instead of physically pure iron, such as electrolyzed pure iron or hydrogen reduced pure iron, as the iron source. The present invention also relates to a method of preparing the high performance rare earth-iron giant magnetostrictive material.

Magnetostrictive material, such as nickel, cobalt, iron and their alloys, undergoes, at room temperature and in a magnetic field, a change in shape along the magnetic field direction, referred to as magnetostriction. Their magnetostriction coefficient were only in the range of tens of ppm, though they were the main vibrative material of the transducer used previously. The researches in early 1960's have discovered that some heavy rare earth elements could result in a magnetostriction coefficient 1000 times larger than that of iron, and 200 times larger than that of nickel. However their functions could be performed only at a low temperature condition while at room temperature, the magnetostrictive performances of the said heavy rare earth elements are by far not as good as that of iron, nickel and cobalt. In early 1970's, it was found first by that the rare earth-iron alloys $TbFe_2$, $DyFe_2$ and $SmFe_2$ have a giant magnetostriction at room temperature. However, these alloys have high magnetocrstalline anisotropy energy. Therefore, only in a high magnetic field could these alloys show high magnetostriction, resulting in a substantial difficulty in practical application. The researches in the later 1970's found that $DyFe_2$ has a magneto crystalline anisotropy that is opposite to that of $TbFe_2$ and $SmFe_2$ alloy, and their anisotropies could compensate and counteract mutually. Accordingly, the oriented multi- or single crystalline tri-element alloy Tb—Dy—Fe and Sm—Dy—Fe, which have a giant magnetostriction even at a low magnetic field and at room temperature have been developed. U.S. Pat. No. 4,308,474, is a valuable and commercialized rare earth-iron giant magnetostrictive material and has been practically used until now. In this patent, disclosed in detail are the elements of the alloy, composition and crystal growth requirement, etc. This patent covers 6 basic alloys: $Tb_xDy_{1-x}Fe_{2-w}$, $Tb_xHo_{1-x}Fe_{2-w}$, $Sm_xDy_{1-x}Fe_{2-w}$, $Sm_xHo_{1-x}Fe_{2-w}$, $Tb_xHo_yDy_zFe_{2-w}$, $Sm_xHo_y$-$Dy_zFe_{2-w}$. Their crystalline axis directions are located within the range of 10° around the maximal magnetostrictive direction [1,1,1] of the crystal cell, wherein the oriented multi- or sing crystal material $Tb_{0.3}Dy_{0.7}Fe_{1.95}$ is the sole commercialized rare earth-iron giant magnetostrictive material. A. E. Clark has described in detail in the authoritative work on the theory about rare earth-iron giant magnetostrictive material "Ferromagnetic Materials (Ed. by E. D. Wohlfarth)", Vol. 1, North Holland, Amsterdam, 1980, PP531 the cubic Laves phase crystal structure and the magnetostriction theory. According to his theory, in the Laves phase, the atoms orientate in different crystallographic directions, and the direction [1,1,1] has the maximal atom density. Under the action of a magnetic field, the specific distribution of the electron cloud of the rare earth-iron atoms undergo a change, the strength of the interaction among the atoms also change, resulting in a change in the distances there between and therefore in a giant magnetostriction effect.

In this circumstance, if the crystallographic direction of the material is just the same to the [1,1,1] direction, the material could have a macroscopic giant magnetostriction effect, and therefore a maximal saturation magnetostriction coefficient. In practical application, as the preferably orienting directions during crystal growth will deviate from the direction [1,1,1] to certain extent in the solidification process of the rare earth-iron compound crystal in Laves phase, the saturation magnetostriction coefficient of the material will be 5% less than the maximum.

Nowadays, the so-called rare earth-iron giant magnetostrictive material means the alloy $Tb_{0.3}Dy_{0.7}Fe_{1.95}$, which is a crystallographic material having a strict (Tb Dy)/Fe atomic ratio, and its performances are closely dependent on the crystallostructure (crystal orientation), and the structure of the crystal phase. Any change to the mutual ratios of the elements, substitution, or addition or reduction of the elements, entrainment of impurities or change of the crystalline direction will bring harm to the giant magnetostriction of the material. However, out of consideration of the costs for raw materials, the industrial production of the material may allow some substitute elements or existence of some entrained impurities; though they may cause some loss of magnetostrictive property, but they may greatly broaden sources of the raw materials and substantially reduce the costs for production of the material, and promote commercialization and application of the material.

U.S. Pat. No. 6,273,966 discloses a high performance rare earth-iron magnetostrictive material having the formula $(R_{x1}R_{x2} \ldots R_{x11})(M_{y1}M_{y2} \ldots M_{y6})_z$, wherein R represents one to eleven rare earth elements selected from the group comprising La, Ce, Pr, Nd, Sm, Gd, Tb, Dy, Ho, Er, and Y; $0 \leq Xi \leq 1$, i=1,2 ..., 11 and x1+x2+...x11= 1; M represents one to six metal elements selected from the group comprising Fe, Mn, Co, Ni, Al, and Si; $0 \leq Yi \leq 1$, i=1,2,3,4,5,6, and y1+y2+y3+y4+y5+y6=1; $1.8 \leq Z \leq 2.1$. This patent specially defines the controlled contents of non-metal impurity elements O, N and C being in the ranges of atom percent of 0: 6011–34000 ppm, N: 575–4400 ppm, C: 939–21000 ppm. Known from the definition of the composition of the magnetostrictive material as disclosed, it allows existence of the non-metal imparities O, N and C within the above-mentioned amounts and of several rare earth-iron elements and transition metal elements. This means that some crude alloys, which could be cheaper and be in a comparatively lower purity, could be used to produce the manetostrictive material having satisfactory performances, so as to keep a balance between its performances and production costs of the material.

Chinese Patent No. ZL98101191.8 discloses a rare earth-iron giant magnetostrictive material having a main orientation in the direction [1,1,0] and a process for its preparation. This material has its chemical formula $(Tb_{1-x-y}Dy_xR_y)(Fe_{1-z-p}B_zM_p)_Q$, wherein R represents at least one of the 5 rare earth-iron elements Ho, Er, Sm, Pr, and Nd; M represents one to six of the 16 non-Rare earth metal elements Ti, V, Cr, Co, Ni, Cu, Zr, Ga, Al, Mg, Ca, Cd, In, Ag, Au, and Pt. The non-metal element B is indicated in the formula without any description about its source and function. According to the requirements set forth in this patent, all of the raw materials should be in purity in the range of from 99.0% to 99.99%, preferably from 99.5% to 99.8%. This patent is mainly aimed at obtaining in industrial scale a multi- or single crystal magnetostrictive material having a main orientation in the direction [1,1,0] by using the raw materials in a comparatively lower purity and by a specific production process. However, this patent still has some problems, such as the raw materials still need to be in a relatively high purity and is of a much-restricted availability, the process and apparatus for its production are still complicated, etc.

Therefore, there is still a strong demand for a high performance rare earth-iron giant magnetostrictive material that could be much cheaper, while guarantee good magnetostrictive performances.

SUMMARY OF THE INVENTION

In accordance with the present invention, there is provided a high performance rare earth-iron giant magnetostrictive material having the advantages of an easier availability of the raw materials, a much cheaper cost for production thereof, and, at the same time, a good magnetostriction.

Further in accordance with the present invention, there is provided a method of preparing the high performance rare earth-iron giant magnetostrictive material, wherein much easily available and much cheaper industry grade pure iron could be used as sole iron source, and much simplified treatment steps of the production are needed, resulting in a rare earth-iron giant magnetostrictive material having either a good magnetostriction and a very competitive production cost.

Still further, in accordance with the present invention, there is provided a high performance rare earth-iron giant magnetostrictive material and method of preparation which contains industry grade pure iron.

Still further, in accordance with the present invention, there is provided a rare earth-iron giant magnetostrictive material having the formula:

$(Tb_{x1}Dy_{x2}Sm_{x3}Ho_{x4}R_{x5})(S_{y1}P_{y2}Fe_{1-y1-y2-y3}T_{y3})_Q$, wherein $0 \leq X1<1$, $0 \leq X2<1$, $0 \leq X3<1$, $0 \leq X4<1$, $0 \leq X5<0.036$, and $X1+X2+X3+X4+X5=1$;

R is at least one rare earth element than other Tb, Dy, Sm, and Ho, and they are entrained into by the later;

$0 \leq Y1<0.01$, $0 \leq Y2<0.01$, $0 \leq Y3<0.05$; $Q=1.8-2.2$;

T is a collective symbol representing the metal elements Mn, V, W, Cu, Al, Zn, Ca, Mg, Ni, Ti, Cr, Co, Mo or Ta etc., which are entrained into the material by an iron source and rare earth sources, and non-metal impurities O, N, C, Si, and H; wherein the non-metal impurities are in the following amount by weight: from about 60 to about 1050 ppm O; up to about 85 ppm N, up to about 120 ppm C; up to about 60 ppm H; and up to about 760 ppm Si.

These and other advantages, aspects, and features will be understood by one of ordinary skill in the art upon reading and understanding the specification.

Figure 1:
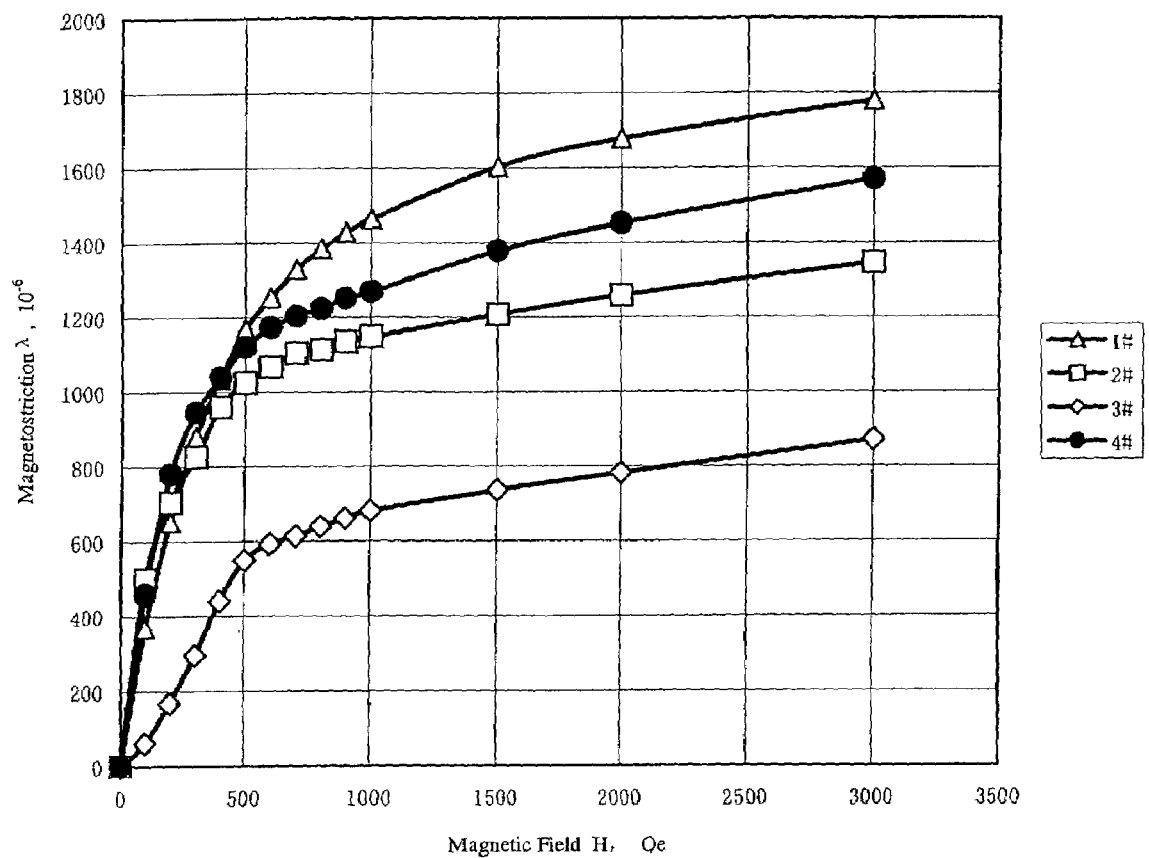
FIG. 1 shows the magnetostriction profiles of the 4 embodied giant magnetostrictive materials (6 MPa)

Curve 1 shows the magnetostriction profile of the embodied material $(Tb_{0.3}Dy_{0.674}R_{0.026})$ $(S_{0.001}P_{0.0004}Fe_{0.987}T_{0.0116})_{1.92}$;

Curve 2 shows the magnetostriction profile of the embodied material $(Sm_{0.85}Dy_{0.13}R_{0.02})(S_{0.0003}P_{0.0005}Fe_{0.9982}T_{0.001})_{1.95}$;

Curve 3 shows the magnetostriction profile of the embodied material $(Sm_{0.62}Dy_{0.12}Ho_{0.24}R_{0.02})$ 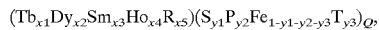 $(S_{0.0003}P_{0.0007}Fe_{0.986}T_{0.013})_{1.95}$; and Curve 4 shows the magnetostriction profile of the embodied material $(Tb_{0.26}Dy_{0.3}Ho_{0.418}R_{0.022})$ 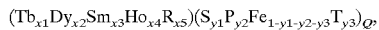 $(S_{0.0006}P_{0.0003}Fe_{0.987}T_{0.0121})_{1.92}$.

DETAILED DESCRIPTION OF THE PREFERRED EMBODIMENTS

The present invention is directed to a rare earth-iron giant magnetostrictive material having the formula:

$(Tb_{x1}Dy_{x2}Sm_{x3}Ho_{x4}R_{x5})(S_{y1}P_{y2}Fe_{1-y1-y2-y3}T_{y3})_Q$, wherein $0 \leq X1<1$, $0 \leq X2<1$, $0 \leq X3<1$, $0 \leq X4<1$, $0 \leq X5<0.036$, and $X1+X2+X3+X4+X5=1$;

R is at least one rare earth element than other Tb, Dy, Sm, and Ho, and they are entrained into by the later;

$0 \leq Y1<0.01$, $0 \leq Y2<0.01$, $0 \leq Y3<0.05$; $Q=1.8-2.2$;

T is a collective symbol representing the metal elements Mn, V, W, Cu, Al, Zn, Ca, Mg, Ni, Ti, Cr, Co, Mo or Ta etc., which are entrained into the material by an iron source and rare earth sources, and non-metal impurities O, N, C, Si, and H; wherein the non-metal impurities are in the following amount by weight: from about 60 to about 1050 ppm O; up to about 85 ppm N, up to about 120 ppm C; up to about 60 ppm H; and up to about 760 ppm Si.

The preferable rare earth-iron giant magnetostrictive material according to the invention comprises, but not limited to:

$(Tb_{x1}Dy_{x2}R_{x5})(S_{y1}P_{y2}Fe_{1-y1-y2-y3}T_{y3})_Q$, wherein $0 \leq X1<1$, $0 \leq X2 \leq 1$, $X3=X4=0$, $0<X5 \leq 0.011$, and $X1+X2+X5=1$;

$(Dy_{x2}Sm_{x3}R_{x5})(S_{y1}P_{y2}Fe_{1-y1-y2-y3}T_{y3})_Q$, 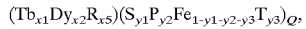

wherein $0 \leq X2<1$, $0 \leq X3<1$, $X1=X4=0$, $0<X5 \leq 0.01$, and $X2+X3+X5=1$;

$(Tb_{x1}Dy_{x2}Ho_{x4}R_{x5})(S_{y1}P_{y2}Fe_{1-y1-y2-y3}T_{y3})_Q$, 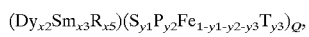

wherein $0 \leq X1<1$, $0 \leq X2<1$, $X3=0$, $0 \leq X4<1$, $0<X5 \leq 0.012$, and $X1+X2+X4+X5=1$;

$(Dy_{x2}Sm_{x3}Ho_{x4}R_{x5})(S_{y1}P_{y2}Fe_{1-y1-y2-y3}T_{y3})_Q$, 

wherein $X1=0$, $0 \leq X2<1$, $0 \leq X3<1$, $0 \leq X4<1$, $0<X5 \leq 0.013$, and $X2+X3+X4+X5=1$. 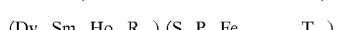

The industry grade pure iron is used as sole iron source for preparing the giant magnetostrictive material according to the invention. The industry grade pure iron means those which could be produced in industrial scale at a low production cost, such as the ones obtained from a blast furnace molten iron or a molten steel of a steel plant by oxygen-blastingly decarbonizing, Mg powder dephosphorizaton, silicium—and calcium desulfurization, aluminium deoxidisation, and then vacuum degassing. So, the elements S and P contained in the industry grade pure iron will be finally brought into the finished giant magnetostrictive material (Referred to as "end product") and become the characterizing elements of the end product of the invention.

Existence of S and P elements at a proper amount could have positive functions, for example, they could improve the brittleness and corrosion-resistance and increase the mechanical strength. The mechanism of S and P elements' positive function might be, but not bound to, that the Mn and Al etc, contained in the alloy are combined with oxygen and then enriched on the interface of crystal cell. However, S element could promote formation of the spherical compounds $RE_xMnS$ and $RE_xMnOS$, this could be helpful for eliminating the negative influence of the entrained elements such as Mn, Al, etc, and for improving the mechanical property of the material. S could also combine with oxygen contained in the alloy and form compounds $RE_2O_2S$, decreasing the negative influence of oxygen to the material and improving its brittleness; In addition, P element could, with promotion of rare earth elements, combine with the metal impurities such as Cu, Ti, etc., that may improve the corrosion-resistance and anti-oxidation of the alloy.

The other non-iron impurity elements that might probably be contained in the iron source, such as O, N, C, Si, and H, will also be brought into the crude alloy. As the smelting treatment is, however, always conducted at vacuum condition, the majority of gasifiable impurities could be removed, enabling an effective control of the contents of elements O, N, C, H and Si in the defined ranges in the end product. As to rare earth elements Tb, Dy, Sm or Ho, one may use such sources that are in a lower purity and have some minor accompanying rare earth and/or non-rare earth metal components, causing a substantial reduction in expense for buying the rare earth raw materials. The accompanying rare earth metal elements are represented by a collective symbol R in the chemical formula and remain in the end product. The non-rare earth metal entrained into by rare earth sources and the non-iron metal elements entrained into by iron source will also substantial remain in the end product, represented by a collective symbol T. If the total amount of T could satisfy the requirement of $y3 \leq 0.05$, the performances of the finished giant magnetostrictive material could then meet the demands in practical application.

The newly discovered magnetostrictive material enjoys the attributes of giant magnetostriction, millisecond response, high energy density, great output, nice linearity and reliability. This is shown in ultrasonic transducers, precise positioning, actuators, mini pump and control valves. The material of the present invention is also cost effective and price competitive.

The method of preparing the high performance rare earth-iron giant magnetostrictive material according to the present invention comprises the following steps:

stoichiometrically metering and blending an iron source and a rare earth source, wherein the iron source is an industry pure grade iron source and the rare earth source is selected from Tb, Dy, Sm and Ho;

smelting the blend into an alloy at a temperature in the range of from 1250 C to 1500 C and at a vacuum condition into a uniform melt;

after having smelted the blend into an uniform melt at the above-mentioned conditions, upholding the melt at a vacuum condition for a period of time to completely unify the alloy and to degas at least a portion of gasifiable impurities therefrom; and directionally solidifying the alloy to obtain an oriented multi- or single crystalline rare earth-iron giant magnetostrictive material.

In a preferable embodiment of the method according to the invention, iron source is obtained from a blast furnace, molten iron, or molten steel of a steel plant, by oxygen-blastingly decarbonizing, Mg powder dephosphorization, silicium- and calcium desulfurization, aluminium deoxidization and then a vacuum degassing.

In another preferable embodiment of the method according to invention, the molten alloy is upheld at a vacuum condition for more than 10 minutes, preferable more than 30 minutes, during the treatment step of unifying the alloy and degassing some gasifiable impurities from the melt.

The method according to the invention has some important advantages. First, it can be carried out using either an iron source in high purity, such as electrolyzed pure iron or hydrogen reduced pure iron, and/or an industry grade pure iron in a relatively lower purity, such as those obtained from processing a blast furnace molten iron or molten steel of a steel plant. This substantially reduces the expense for the raw materials. Secondly, it effectively controls the conditions for alloy-smelting, especially the smelting temperature, guaranteeing a less loss of the rare earth elements through evaporation, even at a vacuum condition. Third, the majority of gasifiable impurities entrained into by the raw materials are finally removed from the end product, because all of the treatment steps of the method are conducted at vacuum condition, enabling a control of the contents of the gasifiable impurities in the end product at a level as low as possible.

Use of industry grade pure iron for preparation of rare earth-iron giant magnetostrictive material according to the invention broadens the iron sources available for production of giant magnetostrictive material. Iron takes about 40% by weight of the total mass in a magnetostrictive material, and the price of industry grade pure iron is lower than $\frac{1}{100}$ of the price of the physically pure iron. This replacement of the physically pure iron by an industry grade pure iron could greatly reduce the cost, up to 30%, for production of the end product.

In order that the present invention may be more clearly understood, examples of the present invention are described with reference to examples provided below.

EXAMPLES 1–4

An industry grade pure iron (Trade brand TD) available from Shanghai Baosban Steel Corporation, Shanghai China, was used as iron source with its main impurity elements listed in Table 1.

The rare earth metal Tb, Dy, Sm and Ho are produced by and available from Jiangxi Rare Earth Research Institute, Jiangxi Province, China. These rare earth raw materials are metered and blended with the iron according to the alloys' compositions listed in Table 2. Then the blends are respectively smelted in a vacuum smelting apparatus according to the method of the invention. The magnetostrictions of the alloys are measured using strain gauge and the results are plotted and demonstrated in FIG. 1.

TABLE 1

Main impurities of industry grade pure iron (Trade brand TD)

| C | Mn | Si | P | S | Cr | Ni | Mo | Cu | Al |
|---|----|----|---|---|----|----|----|----|----|
| 0.025 | 0.2 | 0.05 | 0.018 | 0.012 | 0.08 | 0.2 | 0.2 | 0.25 | 0.08 |

TABLE 2

Compositions of the alloys and processing conditions thereof

| No. | Alloy Composition | Processing conditions |
|-----|-------------------|----------------------|
| 1 | $(Tb_{.3}Dy_{.674}R_{.026})(S_{.001}P_{.0004}Fe_{.987}T_{.0116})_{1.92}$ | Degassing for 50 minutes at 1360° C. and a vacuum condition |

TABLE 2-continued

Compositions of the alloys and processing conditions thereof

| No. | Alloy Composition | Processing conditions |
|---|---|---|
| 2 | $(Sm_{.85}Dy_{.13}R_{.02})(S_{.0003}P_{.0005}Fe_{.9982}T_{.001})_{1.95}$ | Degassing for 30 minutes at 1280° C. and a vacuum condition |
| 3 | $(Tb_{.26}Dy_{.3}Ho_{.418}R_{.022})(S_{.0006}P_{.0003}Fe_{.987}T_{.0121})_{1.92}$ | Degassing for 30 minutes at 1300° C. and a vacuum condition |
| 4 | $(Sm_{.62}Dy_{.12}Ho_{.24}R_{.02})(S_{.0003}P_{.0007}Fe_{.986}T_{.013})_{1.95}$ | Degassing for 30 minutes at 1300° C. and a vacuum condition |

The magnetostriction profiles of the 4 embodied giant magnetostrictive materials are shown in FIG. 1. Curve 1 shows the magnetostriction profile of the embodied material $(Tb_{0.3}Dy_{0.674}R_{0.026})(S_{0.001}P_{0.0004}Fe_{0.987}T_{0.0116})_{1.92}$. Curve 2 shows the magnetostriction profile of the embodied material $(Sm_{0.85}Dy_{0.13}R_{0.02})(S_{0.0003}P_{0.0005}Fe_{0.9982}T_{0.001})_{1.95}$, and shows that it has a negative strain value. Curve 3 shows the magnetostriction profile of the embodied material $(Sm_{0.62}Dy_{0.12}Ho_{0.24}R_{0.02})(S_{0.0003}P_{0.0007}Fe_{0.986}T_{0.013})_{1.95}$, and shows that it has a negative strain value. Curve 4 shows the magnetostriction profile of the embodied material $(Tb_{0.26}Dy_{0.3}Ho_{0.418}R_{0.022})(S_{0.0006}P_{0.0003}Fe_{0.987}T_{0.0121})_{1.92}$.

Although the preferred embodiment has been described in detail, it should be understood that various changes, substitutions, and alterations can be made therein without departing from the spirit and scope of the invention as defined by the appended claims. It will be appreciated that various changes in the details, materials and arrangements of parts, which have been herein described and illustrated in order to explain the nature of the invention, may be made by those skilled in the area within the principle and scope of the invention as will be expressed in the appended claims.

What is claimed is:

1. A method of preparing a high performance rare earth-iron giant magnetostrictive material comprising the steps of:
   stoichiometrically metering and blending an iron source and a rare earth source, wherein the iron source is an industry grade pure iron source and the rare earth source is selected from Tb, Dy, Sm and Ho;
   melting the blend into an alloy at a temperature in the range of from 1250° to 1500° and at a vacuum condition into a melt;
   maintaining the melt at the temperature and the vacuum condition for a period of time to completely mix the melt into a uniform melt and to degas at least a portion of gasifiable impurities therefrom; and
   directionally solidifying the alloy to obtain an oriented multi- or single crystalline rare earth-iron giant magnetostrictive material.

2. The method according to claim 1 wherein the resulting rare earth-iron giant magnetostrictive material has the following formula:

$(Tb_{x1}Dy_{x2}Sm_{x3}Ho_{x4}R_{x5})(S_{y1}P_{y2}Fe_{1-y1-y2-y3}T_{y3})_Q$, wherein $0 \leq X1 < 1$, $0 \leq X2 < 1$, $0 \leq X3 < 1$, $0 \leq X4 < 1$, $0 \leq X5 < 0.036$, and $X1+X2+X3+X4+X5=1$;
R is at least one rare earth element than other Tb, Dy, Sm, and Ho, and they are entrained into by the later;
$0 \leq Y1 < 0.01$, $0 \leq Y2 < 0.01$, $0 \leq Y3 < 0.05$; $Q=1.8-2.2$;
T is a collective symbol representing the metal elements Mn, V, W, Cu, Al, Zn, Ca, Mg, Ni, Ti, Cr, Co, Mo and Ta which are entrained into the material by an iron source, rare earth sources, and non-metal impurities O, N, C, Si, and H; wherein the non-metal impurities are in the following amount by weight: from about 60 to about 1050 ppm O; up to about 85 ppm N, up to about 120 ppm C; up to about 60 ppm H; and up to about 760 ppm Si.

3. The method as in claim 2, further comprising obtaining the iron source from one of the group consisting of blast furnace molten iron and molten steel.

4. The method according to claim 3, further comprising obtaining the iron source by at least one process of oxygen decarburization, Mg powder dephosphorization, and calcium-silicon desulfurization, aluminum deoxidization, and vacuum degassing.

5. The method according to claim 2 wherein the period of time is at least 10 minutes.

6. The method according to claim 2 wherein the period of time is at least 30 minutes.

7. The method according to claim 2, wherein the resulting rare earth-iron giant magnetostrictive material further comprises:
   an effective amount of S; and
   an effective amount of P.

\* \* \* \* \*